(12) United States Patent
Roy et al.

(10) Patent No.: US 9,236,407 B2
(45) Date of Patent: Jan. 12, 2016

(54) IMAGE SENSOR

(71) Applicants: STMicroelectronics S.A., Montrouge (FR); Commissariat à l'Énergie Atomique et aux Énergies Alternatives, Paris (FR)

(72) Inventors: François Roy, Seyssins (FR); Yvon Cazaux, Grenoble (FR)

(73) Assignees: STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 69 days.

(21) Appl. No.: 14/144,168

(22) Filed: Dec. 30, 2013

(65) Prior Publication Data
US 2014/0183685 A1  Jul. 3, 2014

(30) Foreign Application Priority Data

Jan. 2, 2013 (FR) ..................................... 13 50008

(51) Int. Cl.
*H01L 27/146* (2006.01)

(52) U.S. Cl.
CPC ...... *H01L 27/14603* (2013.01); *H01L 27/1463* (2013.01); *H01L 27/14614* (2013.01); *H01L 27/14656* (2013.01)

(58) Field of Classification Search
CPC .................. H01L 27/1461; H01L 27/14612; H01L 27/14609
See application file for complete search history.

(56) References Cited

U.S. PATENT DOCUMENTS

| | | | |
|---|---|---|---|
| 2009/0266973 A1 | 10/2009 | Roy et al. | |
| 2011/0019038 A1* | 1/2011 | Okuno | 348/246 |
| 2011/0096208 A1* | 4/2011 | Roy et al. | 348/243 |
| 2012/0018618 A1 | 1/2012 | Roy | |
| 2012/0161213 A1 | 6/2012 | Roy et al. | |
| 2012/0273654 A1* | 11/2012 | Hynecek | H01L 27/1464 250/208.1 |

OTHER PUBLICATIONS

French Search Report and Written Opinion dated Sep. 19, 2013 from corresponding French Application No. 13/50008.

* cited by examiner

*Primary Examiner* — Peniel M Gumedzoe
*Assistant Examiner* — Christopher Johnson
(74) *Attorney, Agent, or Firm* — Gardere Wynne Sewell LLP (57) ABSTRACT

An image sensor arranged inside and on top of a semiconductor substrate, having a plurality of pixels, each including: a photosensitive area, a read area, and a storage area extending between the photosensitive area and the read area; at least one first insulated vertical electrode extending in the substrate between the photosensitive area and the storage area; and at least one second insulated vertical electrode extending in the substrate between the storage area and the read area.

22 Claims, 4 Drawing Sheets

IMAGE SENSOR

CROSS REFERENCE TO RELATED APPLICATION

This application claims priority to French Patent Application No. 13/50008, filed Jan. 2, 2013, which is hereby incorporated by reference to the maximum extent allowable by law.

BACKGROUND

1. Technical Field

The present disclosure relates to an image sensor comprising a plurality of pixels formed inside and on top of a semiconductor substrate. A sensor adapted to a so-called global shutter control mode, that is, where all sensor pixels are simultaneously exposed, is here more specifically considered.

2. Discussion of the Related Art

Pixel structures compatible with a global shutter control have been provided. Such structures however all have their specific disadvantages.

SUMMARY

Thus, an embodiment provides an image sensor arranged inside and on top of a semiconductor substrate, having a plurality of pixels, each comprising: a photosensitive area, a read area, and a storage area extending between the photosensitive area and the read area; at least one first insulated vertical electrode extending in the substrate between the photosensitive area and the storage area; and at least one second insulated vertical electrode extending in the substrate between the storage area and the read area.

According to an embodiment, the first electrode comprises at least one opening defining a charge transfer area between the photosensitive area and the storage area.

According to an embodiment, the second electrode comprises at least one opening defining a charge transfer area between the storage area and the read area.

According to an embodiment, the photosensitive area is partially delimited by at least one third insulated vertical electrode extending in the substrate.

According to an embodiment, the sensor further comprises a charge drain-off area juxtaposed to the storage area.

According to an embodiment, at least one fourth insulated vertical area extends in the substrate between the photosensitive area and the charge drain-off area.

According to an embodiment, the fourth electrode comprises at least one opening defining a charge transfer area between the photosensitive area and the charge drain-off area.

According to an embodiment, the charge drain-off area is connected to a high power supply rail of the sensor.

According to an embodiment, the sensor further comprises a control circuit capable of applying control signals to the vertical electrodes.

According to an embodiment, the read area is coupled to a read circuit of the sensor.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
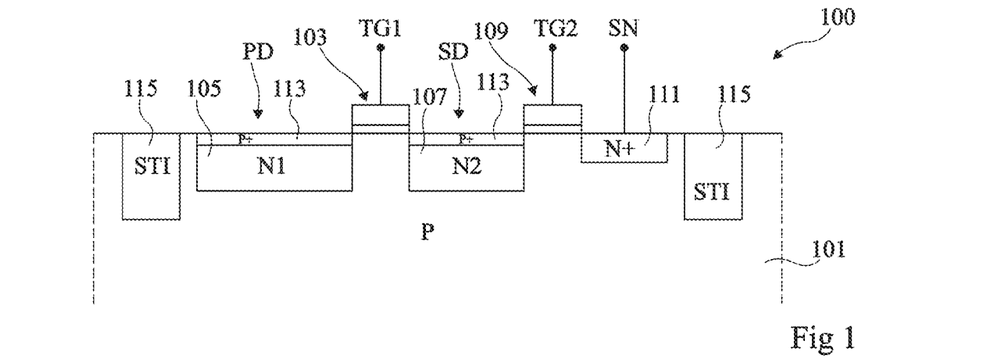
FIG. 1 is a simplified partial cross-section view of an example of an image sensor pixel.

FIG. 1 is a partial simplified cross-section view of an example of a pixel 100 of an image sensor formed inside and on top of a semiconductor substrate 101. In this example, substrate 101 is lightly P-type doped (P−). Pixel 100 comprises an insulated gate structure 103 formed on substrate 101. On either side of gate 103, are present, at the surface of substrate 101, N-type doped regions 105 and 107. Region 105 (to the left of gate 103 in the drawing) forms with substrate 101 the junction of a photodiode PD. Region 107 (to the right of gate 103) forms with substrate 101 the junction of a diode SD defining an intermediate charge storage area of the pixel. In this example, region 107 has, in top view, a smaller surface area than region 105, and has a doping level (N2) greater than that (N1) of region 107. Diodes PD and SD further comprise, at the surface of regions 105 and 107, a shallow heavily-doped P-type region 113 (P+). Photodiode PD and diode SD are called depleted diodes or pinned diodes since the voltage of regions 105 and 107 is, in the absence of lighting and after the charge transfer, only set by the dopant concentrations of regions 101, 105, 107, and 113. Pixel 100 further comprises, next to region 107 and opposite to gate 103 (to the right of region 107 in the drawing), a second insulated gate structure 109 formed on substrate 101, parallel to structure 103. Next to gate 109 and opposite to region 107 (to the right of gate 109 in the drawing), is present a heavily-doped N-type region 111 (N+) formed at the surface of substrate 101, defining a pixel read area. Region 111 is more heavily doped and has a smaller surface area (in top view) than region 107. Gates 103 and 109 and region 111 are connected by metallizations (not shown), respectively to nodes TG1 and TG2 of application of control signals, and to a node SN connected to a voltage reading circuit. The structure of FIG. 1 also comprises an insulating trench 115 formed around pixel 100, which limits crosstalk between the different photodiodes, that is, the capture, by a photodiode, of electrons intended to reach a nearby photodiode. Trench 115 may be of STI ("Shallow Trench Isolation") type, that is, a shallow trench filled with silicon oxide.

When the sensor is illuminated, photons penetrate into the substrate and form electron/hole pairs therein. The electrons are then attracted into accumulation region 105. When an adapted voltage is applied to gate 103, a channel forms at the surface of substrate 101 under gate 103, and the electrons stored in region 105 are brought towards storage region 107. When an adapted voltage is applied to gate 109, a channel forms at the surface of substrate 101 under gate 109, and the electrons stored in region 107 are brought towards read region 111, and then toward the read circuit (not shown) via node SN.

The pixel structure of FIG. 1 is compatible with global shutter control modes. As a specific example of global shutter control mode, it may be provided to apply, to gates 103 of all the sensor pixels, a same pulse signal TG1, for example, periodic, capable of simultaneously controlling, in all sensor pixels, the transfer of the charges accumulated in photodiode PD of the pixel to intermediate storage diode SD of the pixel. The end of a pulse of signal TG1 marks the end of an integration period of the sensor, and the beginning of the next integration period. During the integration, in each pixel, a quantity of electrons depending on the light intensity received by the pixel accumulates in photodiode PD. During the transfer pulse of signal TG1, the photogenerated electrons contained in the photodiode are transferred to storage diode SD of the pixel, which resets photodiode PD to its specific steady state voltage, set by the doping levels. Intermediate storage diodes SD thus enable to temporarily store, in analog form, the image acquired by photodiodes PD during the integration. Before the end of the next integration period, it may be provided to scan all the sensor pixels, and, in each pixel, to transfer the charges contained in diode SD of the pixel to read region 111 of the pixel (which resets diode SD), and then to read the voltage of read node SN connected to region 111. More specifically, before the end of the new integration period, it may be provide to implement, in each pixel, the successive steps of: a) resetting read node SN to a reference voltage; b) reading the voltage of node SN; c) applying to gate 109 a signal TG2 capable of controlling the transfer of the charges stored in diode SD to region 111; and d) reading again the voltage at node SN. The voltage value difference on node SN between the first and the second read step is representative of the quantity of charges transferred from diode SD, and thus of the light intensity received by photodiode PD of the pixel during the previous integration period. This difference may be digitized and stored to generate a digital image. When the sensor pixels are arranged in an array network, the sensor may, for example, be scanned line by line, and successive steps a) to d) may be simultaneously implemented in all the pixels of the selected line.

The pixel structure of FIG. 1 has good performance in global shutter control applications, especially due to the provision of the intermediate storage area formed by diode SD, which significantly limits image distortion phenomena associated with the temporal noise of the transistor (not shown) controlling the resetting of read areas 111 (also called kTc noise). Such a structure may, however, be improved.

For a given charge storage capacity in photodiode PD and in storage diode SD, it would be desirable to decrease the substrate surface area taken up by pixel 100. To achieve this, it is possible to decrease the size of diodes PD and SD at the surface of substrate 101, and to increase the thickness of storage regions 105 and 107 to keep a constant electron accumulation volume. However, since the channels allowing charge transfers from region 105 to region 107 and from region 107 to region 111 are formed at the surface of substrate 101, a thickness increase of storage regions 105 and 107 beyond from 0.5 to 1 µm would make it difficult, or even impossible, to transfer all the charges from region 105 to region 107, and/or from region 107 to region 111. Incomplete transfers may occur, especially causing unwanted afterglow phenomena. Further, increasing the thickness of accumulation regions 105 and 107 would result in amplifying the depth of the potential wells containing the photogenerated charges, and it would then be necessary to apply a higher transfer voltage to gates 103 and 109. Another possibility would be to decrease the size of diodes PD and SD at the surface of substrate 101 without increasing the thickness of regions 105 and 107, but increasing their doping levels. However, it would then be necessary to apply a higher transfer voltage to gates 103 and 109.

Further, in the structure of FIG. 1, the potential wells containing the photogenerated charges are only set by the doping levels. Since the potential well of storage diode SD has to be deeper than that of photodiode PD to provide the charge transfer from photodiode PD to diode SD with no risk of backward flow, this implies that the doping levels of diodes SD and PD should be different.

Further, pixel insulation trench 115 limits the crosstalk, without completely canceling it. Indeed, trench 115 may typically have a depth approximately ranging from 0.3 to 1 µm, while charges may be photogenerated all the way down to a depth approximately ranging from 3 to 10 µm in the substrate (according to the wavelength of the incident beam). Photogenerated charges may thus pass under trench 115 and be captured by a photodiode different from that for which they were intended.

Figure 2:
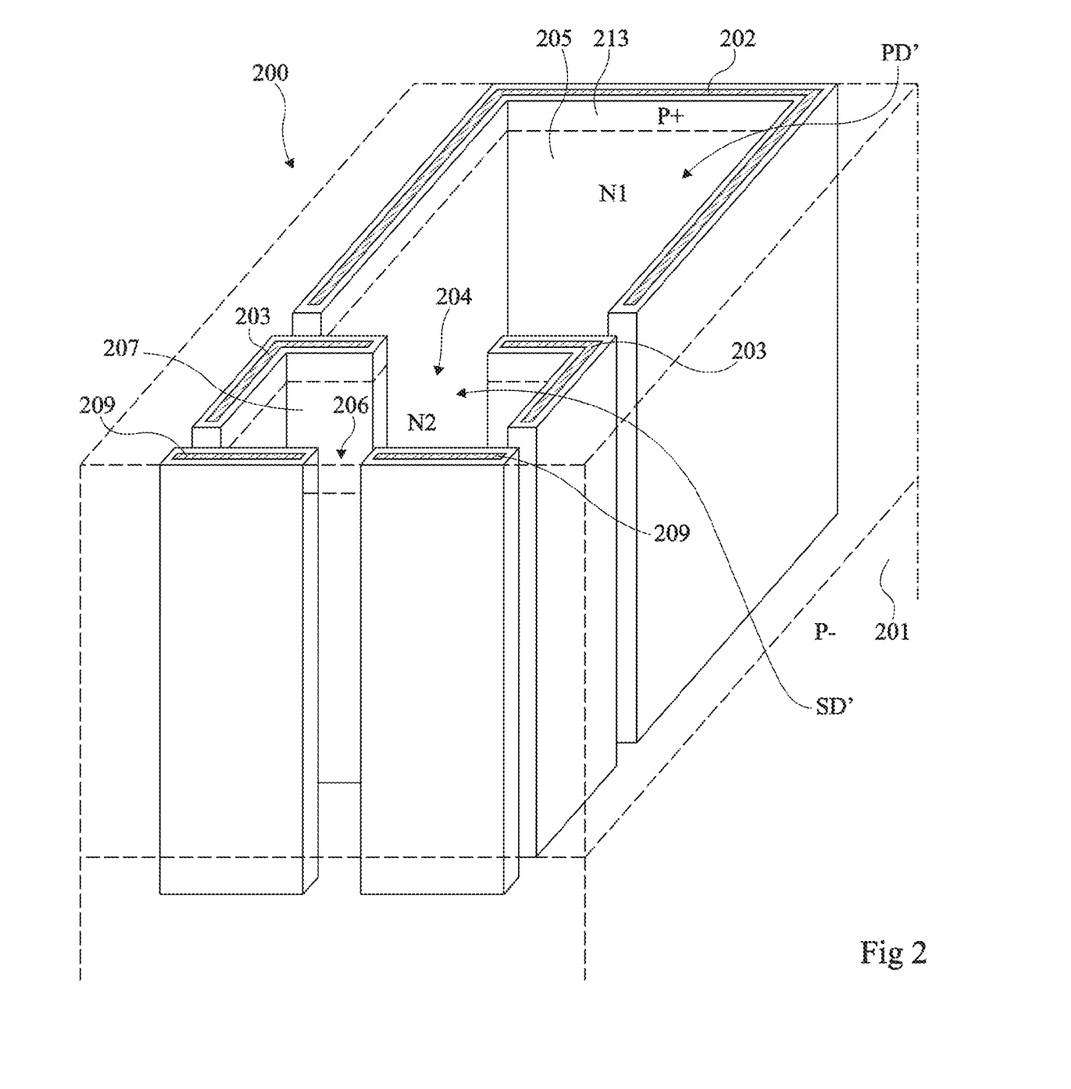
FIGS. 2 and 3A to 3G illustrate an embodiment of an image sensor pixel.
Figure 3A:
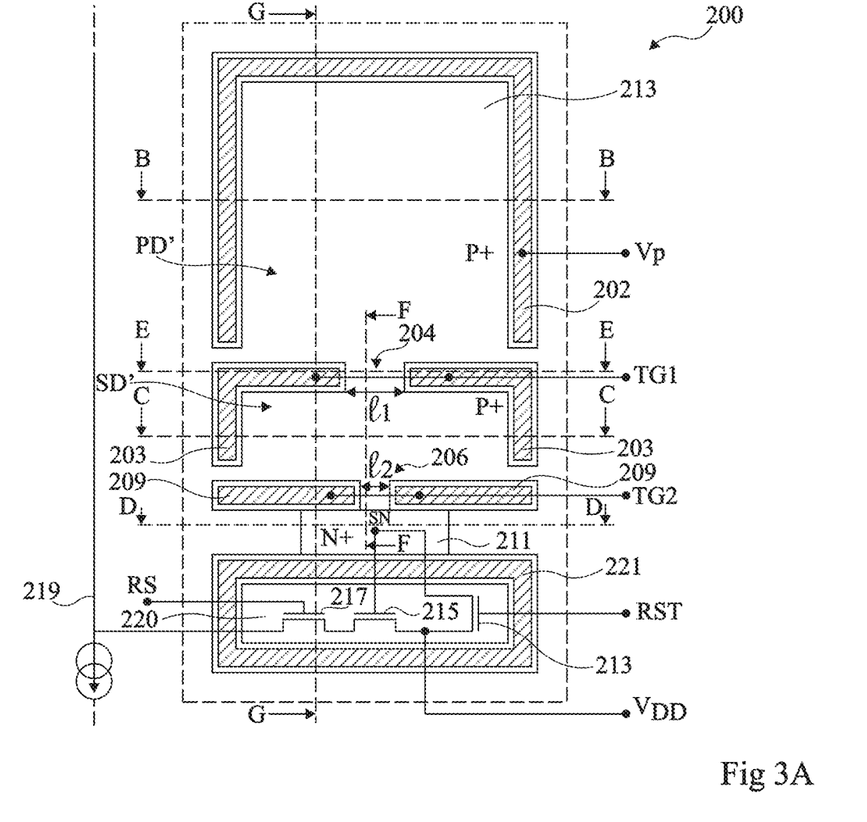
Figure 3B:
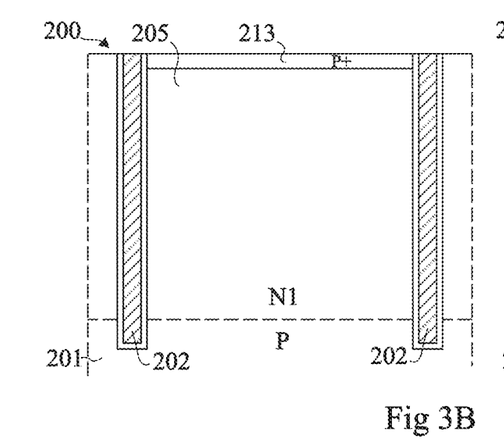
Figure 3C:
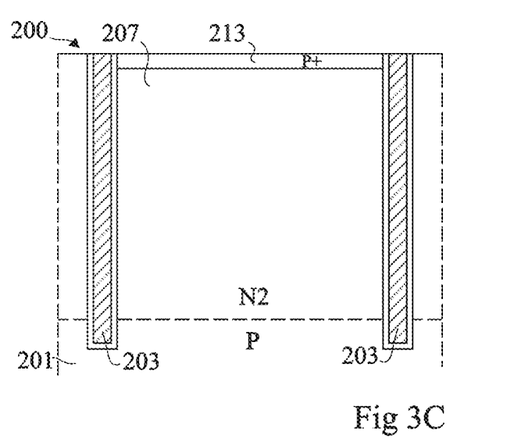
Figure 3D:
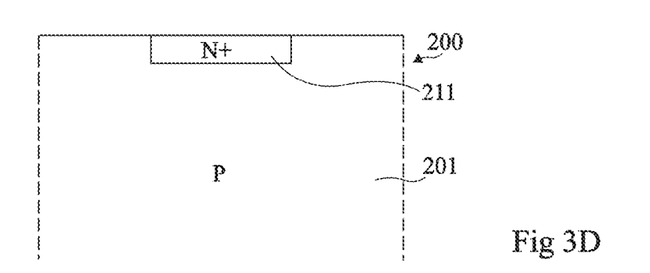
Figure 3E:
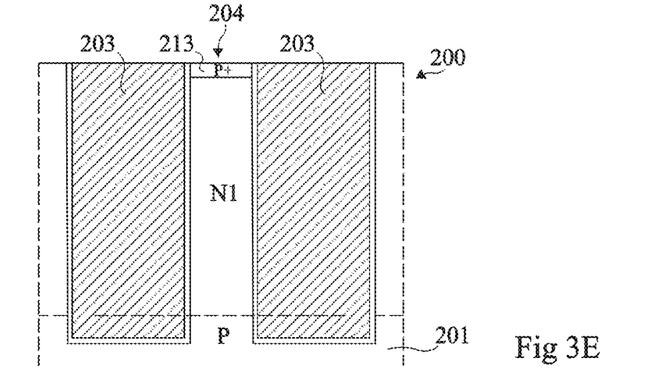
Figure 3F:
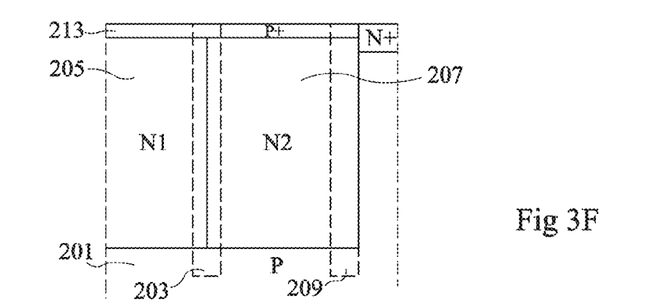
Figure 3G:
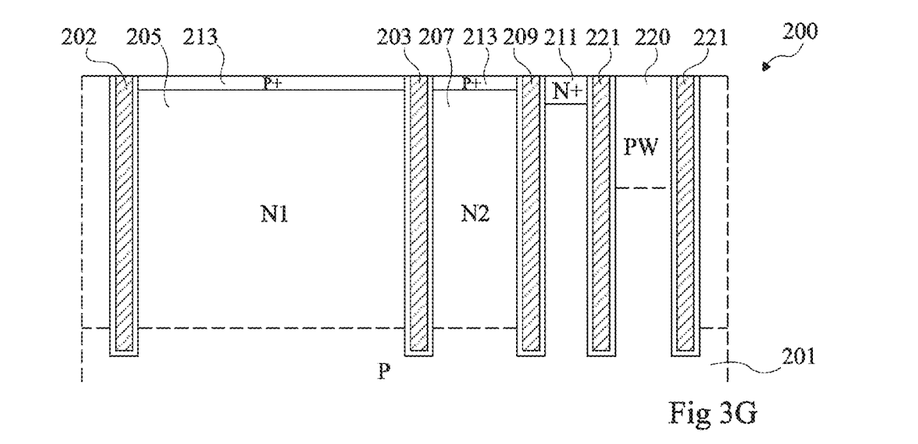

An embodiment improves the structure described in relation with FIG. 1. FIGS. 2 and 3A to 3G illustrate an embodiment of an image sensor pixel 200 formed inside and on top of a semiconductor substrate 201, for example, made of silicon. FIG. 2 is a partial perspective view of pixel 200. FIG. 3A shows this pixel in top view. FIGS. 3B to 3G are side cross-section views respectively along planes B-B, C-C, D-D, E-E, F-F, and G-G of FIG. 3A.

Pixel 200 comprises a photosensitive area, an intermediate charge storage area, a read area connected to a read and processing circuit, and a device for transferring charges from the photosensitive area to the storage area, and from the storage area to the read area. For clarity, the read area and the read and processing circuit have not been shown in the perspective view of FIG. 2.

In this example, substrate 201 is lightly P-type doped (P−). The photosensitive area of pixel 200 comprises an N-type doped well 205, of doping level N1, forming with substrate 201 the junction of a photodiode PD'. The intermediate storage area of the pixel comprises, juxtaposed to well 205, an N-type doped well 207, of doping level N2, forming with substrate 201 the junction of a diode SD'. Wells 205 and 207 are formed at the upper portion of substrate 201. In this example, wells 205 and 207 have the same depth. Wells 205 and 207 are, for example, approximately parallelepipedal with a common side. In this example, well 205 has, in top view, a surface area greater than that of well 207, and its doping level (N1) is smaller than that (N2) of well 207, so that diodes PD' and SD' have similar or equal charge storage capacities. A thin heavily-doped P-type layer 213 (P+) may be formed at the surface of wells 205 and 207. Photodiode PD' and diode SD' are of depleted or pinned diode type. The read area of pixel 200 comprises, juxtaposed to well 207, on the side of well 207 opposite to well 205 in this example, a heavily-doped N-type region 211 (N+). Region 211 is more heavily doped than wells 205 and 207, and is formed at the surface of substrate 201 across a thickness smaller than that of the wells. As an example, wells 205 and 207 may have a thickness ranging between 1 and 10 µm, and preferably between 2 and 4 µm, and read region 211 may have a thickness ranging between 0.1 and 0.5 µm.

An insulated vertical gate or electrode 203 extends in the substrate between wells 205 and 207, at the level of their common side. Electrode 203 preferably extends down to a depth at least equal to that of wells 205 and 207. Electrode 203 insulates well 205 from well 207, except in a charge transfer area 204 where electrode 203 comprises an opening connecting well 205 to well 207. Area 204 preferably extends along the entire height of wells 205 and 207. In the shown example, electrode 203 extends all the way down to a depth slightly greater than that of the wells and has, in top view, the shape of a U delimiting most of three sides of well 207, the horizontal bar of the U being located opposite to the common side of wells 205 and 207. Electrode portion 203 located between wells 205 and 207 (corresponding to the horizontal bar of the U in top view) comprises an opening in the form of a vertical strip of width $l_1$, which extends all along the height of the electrode and defines transfer area 204.

Another insulated vertical gate or electrode 209 extends in the substrate between well 207 and read region 211, at the level of their common side. Electrode 209 preferably extends all the way down to a depth at least equal to that of well 207. Electrode 209 insulates well 207 from region 211, except in a charge transfer area 206, where electrode 209 comprises an opening connecting well 207 to region 211, this opening preferably extending along the entire height of well 207. In the shown example, electrode 209 extends down to a depth slightly greater than that of well 207, and has the shape of a vertical wall 207 juxtaposed to region 211 (that is, the side of well 207 opposite to transfer area 204), and comprises an opening having the form of a vertical strip of width $l_2$, which extends all along the electrode height and defines transfer area 206.

In this example, another insulated vertical gate or electrode 202 laterally delimits most of the three sides of well 205 not limited by electrode 203. Electrode 202 preferably extends down to a depth at least equal to that of well 205.

To form electrodes 202, 203, and 209, one may, for example, form, around wells 205 and 207, trenches vertically extending in the substrate from its front surface, according to a pattern corresponding to the desired electrode shape. The lateral walls and the bottom of the trenches may be coated with an insulating material, for example comprising silicon oxide, after which the trenches may be filled with a conductive material. As an example, the conductive material for filling the trenches is heavily-doped polysilicon, for example with a doping level ranging between $1 \times 10^{18}$ atoms/cm$^3$ and $1 \times 10^{20}$ atoms/cm$^3$. As a variation, the material for filling the conductive trench may be a metal, for example, a metal from the group comprising copper and tungsten. As an example, the trenches may have a depth ranging between 1 and 10 µm, and preferably between 2 and 5 µm, and a width ranging between 0.1 and 0.5 µm.

The upper surfaces of electrodes 202, 203, and 209 and of region 211 are connected by metallizations (not shown), respectively to a node $V_P$ of application of a bias signal, to nodes TG1 and TG2 of application of charge transfer control signals, and to a node SN connected or coupled to a voltage reading circuit.

In the shown example, the read circuit (FIG. 3A) comprises a transistor 213 connecting node SN to a high power supply rail $V_{DD}$ of the sensor, a transistor 215 assembled as a follower source, having its gate connected to node SN and having its drain connected to rail $V_{DD}$, and a transistor 217 connecting the source of transistor 215 to a read line 219 of an array network comprising pixel 200. The gate of transistor 213 is connected to a node RST of application of a signal for controlling the resetting of region 211, and the gate of transistor 217 is connected to a node RS of application of a signal for selecting pixel 200. In this example, transistors 213, 215, and 217 are formed in a P-type well 220 (PW), laterally delimited by an insulating region 221. In this example, insulating region 221 comprises a trench with insulated walls filled with a conductive material surrounding well 220, where this trench may be formed at the same time as vertical electrodes 202, 203, and 209. As a variation, insulating region 221 may be replaced with any other known device for peripherally insulating a well comprising transistors, for example, an STI-type trench or a junction insulation.

An example of a mode for using or controlling pixel 200 of FIGS. 2 and 3A to 3G will now be described.

In a charge accumulation or integration phase, signals $V_P$ and TG1 are set to a reference voltage. As an example this voltage may be the ground voltage, or may be negative with respect to ground, for example, on the order of −1 V. Such a biasing of electrodes 202 and 203 causes an accumulation of holes along the walls of the vertical trenches delimiting the photosensitive area. Holes also accumulate in transfer area 204, thus blocking electron exchanges between wells 205 and 207. Since substrate 201 is also biased to a reference voltage, for example, the ground voltage, a potential well forms in well 205, which, in the absence of lighting, depends on the doping levels and on the bias voltages of the electrodes and of the substrate. When photodiode PD' is illuminated, electron/hole pairs are photogenerated in the photodiode, and the photogenerated electrons are attracted towards well 205 and trapped therein.

In a phase of transfer of the photogenerated charges accumulated in photodiode PD' to intermediate storage diode SD', signal $V_P$ remains unchanged, that is, electrode 202 remains biased to the same reference voltage as during the accumulation phase. This same reference voltage is also applied to signal TG2, which causes the accumulation of holes in transfer area 206, thus blocking electron exchanges between well 207 and region 211. Signal TG1 is set to a value greater than the maximum potential of the potential well formed in photodiode PD' during the integration, for example, at a value ranging between 2 and 3 V. This causes the transfer of all the photogenerated electrons contained in well 205 into well 207, via transfer area 204. Once the transfer has been performed, signal TG1 is set back to the same low value as signals $V_P$ and TG2, to create, in well 207, a potential well capable of maintaining the transferred electrons confined in well 207, until a subsequent transfer to read area 211. At this stage, photodiode PD' is devoid of any photogenerated charge (that is, in a reset state), and a new integration phase may start.

In a phase of transfer of the charges contained in intermediate area SD' to read area 211, signals $V_P$ and TG1 are maintained at the same low value reference voltage as during the integration phase. Signal TG2 is set to a value greater than the maximum potential of the potential well formed in diode SD' during the intermediate storage phase, for example, at a value ranging between 2 and 3 V. This causes the transfer of all the photogenerated electrons contained in well 207 into region 211, via transfer area 206. Once the transfer has been performed, signal TG2 is set back to the same low value as signals $V_P$ and TG1, to block electron exchanges between well 207 and region 211. At this stage, diode SD' is devoid of any photogenerated charge (that is, in a reset state).

It should be noted that in the shown example, width $l_1$ of transfer area 204 is greater than width $l_2$ of transfer area 206. This enables, although areas 204 and 206 do not have the same doping level, to use similar high and low level signals TG1 and TG2 to respectively control the conduction and the blocking of areas 204 and 206. As a variation, transfer areas 204 and 206 of same width may be provided while using signals TG1 and TG2 of different levels.

The pixel structure of FIGS. 2 and 3A to 3G is compatible with a global shutter control, for example, a control of the type described hereabove in relation with FIG. 1. Such a structure especially enables, due to the provision of intermediate storage area SD', to avoid distortion phenomena associated with the reset noise of read areas 211 of the sensor (kTc noise).

An advantage of the structure of FIGS. 2 and 3A to 3G is that, for a given charge storage capacity in the photosensitive area and in the intermediate storage area, it enables to considerably decrease the substrate surface area occupied (in top view) by the pixel with respect to structures of the type described in relation with FIG. 1, using horizontal transfer gates formed on the substrate surface. Indeed, in the structure of FIGS. 2 and 3A to 3G, the use of vertical gates and transfer areas enables to significantly increase the thickness of the N-type accumulation layers of the photodiode and of the storage diode, while providing complete charge transfers between the different pixel areas, thus avoiding unwanted afterglow phenomena. The surface area occupied, in top view, by the pixel, can thus be decreased.

Another advantage is that the biasing of the vertical electrodes to a reference voltage during the integration and intermediate storage phases, which forms a hole accumulation around these electrodes, enables to eliminate dark currents which are usually formed in image sensors, at the interface with the pixel insulation areas.

Another advantage of the structure of FIGS. 2 and 3A to 3G is that the insulated vertical electrodes form, between neighboring pixels, deep separations that significantly limit the crosstalk.

Figure 4:
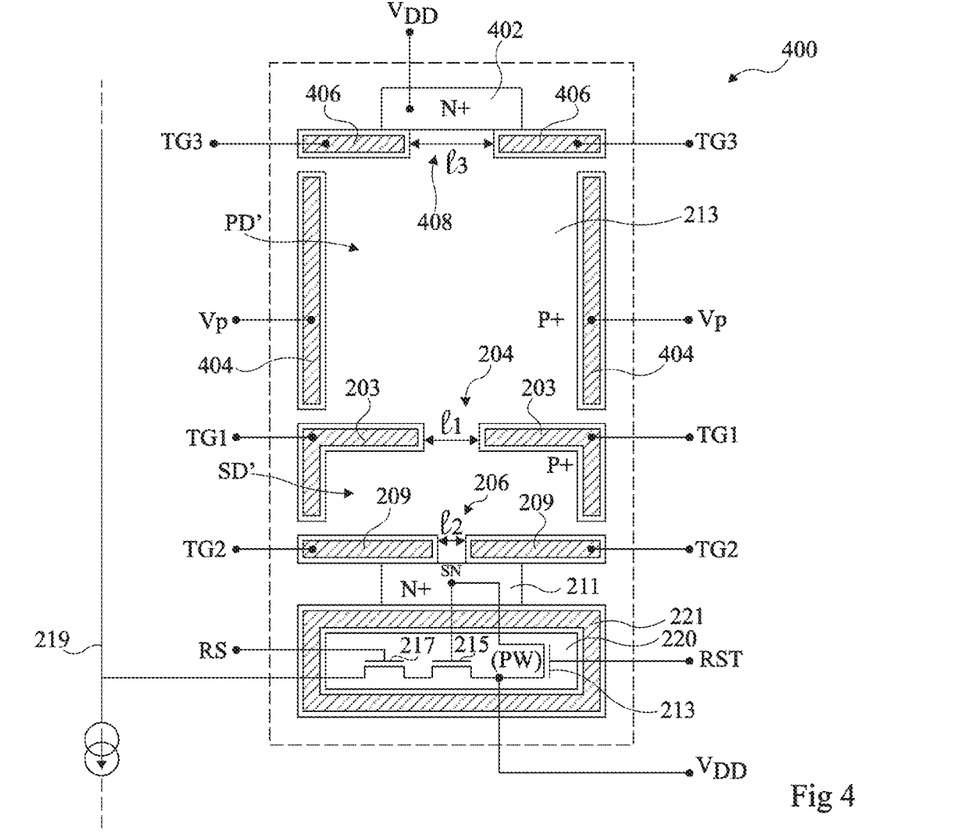
FIG. 4 is a top view of an alternative embodiment of the pixel of FIGS. 2 and 3A to 3G.

FIG. 4 is a top view illustrating an alternative embodiment of the pixel of FIGS. 2 and 3A to 3G. Pixel 400 of FIG. 4 comprises many elements common with pixel 200 of FIGS. 2 and 3A to 3G. Only the differences between the two structures will be described herein. Pixel 400 essentially differs from pixel 200 in that it comprises, in addition to pixel 200, an anti-blooming device enabling to avoid, in the case of a saturation of photodiode PD' during an integration period, for a surplus of photogenerated charges to flow into intermediate storage area SD', causing a pollution of the image acquired during the previous integration period.

The anti-blooming device of pixel 400 comprises, juxtaposed to well 205, a heavily-doped N-type region 402 (N+). In this example, region 402 is located on the side of well 205 opposite to well 207. More generally, region 402 may be located on the side of any of the free edges (that is, the edges which are not juxtaposed to well 207) of well 205. Region 402 is formed at the surface of substrate 201 across a thickness smaller than that of wells 205 and 207. Region 402 is for example formed at the same time as read region 211 of the pixel. Vertical electrode 202 of pixel 200, delimiting the three sides of photodiode PD' which are not delimited by electrode 203, is, in pixel 400, replaced with two insulated vertical electrodes or gates respectively bearing references 404 and 406. Electrode 406 extends between well 205 and region 402, at the level of their common side, preferably down to a depth at least equal to that of well 205. Electrode 406 insulates well 205 from region 402, except in a charge transfer area 408, where electrode 406 comprises an opening connecting well 205 to region 402, this opening preferably extending along the entire height of well 205. In this example, electrode 406 extends down to a depth slightly greater than that of well 205, and has the shape of a vertical wall delimiting most of the side of well 205 juxtaposed to region 402, and comprises an opening in the form of a vertical strip of width $l_3$, which extends along the entire height of the electrode and defines transfer area 408. Electrode 404 comprises two parallel vertical walls respectively delimiting the two sides of well 205 not delimited by electrodes 203 and 406. Electrode 404 preferably extends down to a depth at least equal to that of well 205.

The upper surfaces of electrodes 404 and 406 and of region 402 are connected by metallizations (not shown), respectively to a node $V_P$ of application of a bias signal, to a node TG3 of application of a charge transfer control signal, and to a charge drain-off device, for example, a high power supply rail $V_{DD}$ of the sensor.

Figure 5:
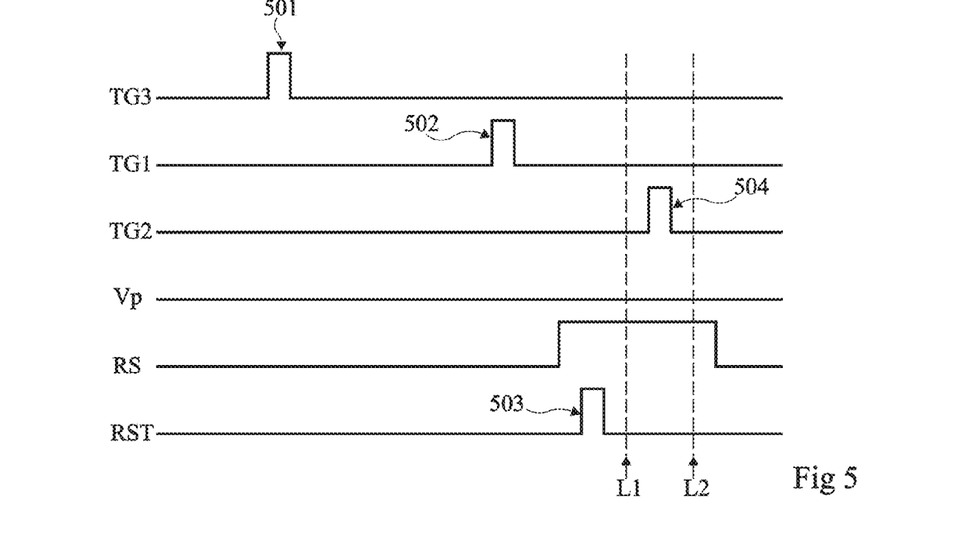
FIG. 5 is a timing diagram illustrating an example of a control mode of the pixel of FIG. 4.

FIG. 5 is a timing diagram illustrating an example of a mode for controlling the pixel of FIG. 4. FIG. 5 shows the time variation of signals TG3, TG1, TG2, $V_P$, RS, and RST for controlling pixel 400, in a cycle comprising a phase of integration of photodiode PD', a phase of transfer of the photogenerated charges from photodiode PD' to intermediate diode SD', and a phase of reading of the charge level of intermediate diode SD'.

Before the beginning of an integration phase, signals TG1 and $V_P$ are in a low state, and a pulse 501 is applied to signal TG3. During pulse 501, signal TG3 is set to a voltage capable of causing the transfer of all the photogenerated charges contained in well 205 to region 402 via transfer area 408, for example, a voltage ranging between 2 and 3 V. This amounts to using the anti-blooming device to reset photodiode PD'. Once the reset has been performed, signal TG3 is set back to the same low state as signals $V_P$ and TG1, which blocks electron exchanges between well 205 and region 402. The falling edge of pulse 501 marks the beginning of the integration period.

At the end of the integration period, signals TG3 and $V_P$ remain in the low state, and signal TG2 is also set to the low state to block electron exchanges between intermediate diode SD' and read region 211. A pulse 502 is applied to signal TG1. During pulse 502, signal TG1 is set to a voltage capable of causing the transfer of all the photogenerated charges contained in well 205 to well 207 via transfer area 204. The falling edge of pulse 502 marks the end of the integration period.

After the end of the integration period and before the end of a next integration period (not shown), during a phase of reading of the charge level contained in well 207, transistor 217 of the read circuit (transistor of selection of pixel 400) is turned on. To achieve this, signal RS is, in this example, set to a high state. A pulse 503 is then applied to signal RST, causing the resetting of read region 211 to the voltage of rail $V_{DD}$ (to within the voltage drop of transistor 213). After the end of pulse 503, the voltage at node SN is then read during a read step L1. After read step L1, a pulse 504 is applied to signal TG2. During pulse 504, signal TG2 is set to a voltage capable of causing the transfer of all the photogenerated charges contained in well 207 to read region 211 via transfer area 206. After the end of pulse 504, the voltage at node SN is read again during a read step L2. Signal RS for selecting pixel 400 can then be set back to a low state while waiting for a new integration/transfer/read cycle. The difference between the voltage read from node SN at step L1 and the voltage read from node SN at step L2 may be digitized to generate an output value of the pixel. Read steps L1 and L2 are preferably very close in time, to minimize distortion phenomena associated with the temporal noise of reset transistor 213.

It should be noted that in the shown example, width $l_3$ of transfer area 408 is greater than width $l_1$ of transfer area 204. This enables to obtain the desired anti-blooming effect, that is, during integration phases, in the case of a saturation, the surplus of photogenerated charges which cannot be contained in photodiode PD' preferentially flow into region 402 rather than into region 207. As a variation, it may be provided to vary the bias voltages of electrodes 203 and 406 to obtain the desired anti-blooming effect.

Specific embodiments have been described. Various alterations, modifications, and improvements will readily occur to those skilled in the art.

In particular, the described embodiments are not limited to the example of read circuit shown in FIGS. 3A and 4. It will be within the abilities of those skilled in the art to obtain the desired manufacturing by using other known read circuits.

Further, in the described structure, certain insulated vertical electrodes (especially electrodes 203 and 209 and electrode 406) each comprise two separate electrode portions. In the described control modes, the separate portions of a same electrode receive a same control signal. As a variation, it may be provided to consider such separate electrode portions as separate electrodes, and to apply different control signals thereto. As an example, to control the charge transfer from one semiconductor area to another, it may be provided to apply a positive signal to a single one of the two portions of electrode 203, 209, or 406 respectively.

More generally, the described embodiments are not limited to the specific examples of layout and of configuration of the vertical electrodes shown in FIGS. 2, 3A to 3G, and 4. The desired advantages may be obtained by providing other layouts of the insulated vertical electrodes, and/or a number of insulated vertical electrodes per pixel greater than what has been shown.

Further, image capture devices where the photosensitive area and the intermediate storage area are pinned diodes have been described herein. It should be understood that any type of photosensitive element and any type of storage element may be delimited by the described vertical electrodes. For example, a photodiode and an intermediate storage diode devoid of heavily-doped P-type area 213 may be considered.

Further, the described embodiments are not limited to the case where electron accumulation wells 205 and 207 have the same depth.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An image sensor arranged inside and on top of a semiconductor substrate, having a plurality of pixels, each comprising:
    a photosensitive area, a read area, and a storage area extending between the photosensitive area and the read area;
    at least one first insulated vertical electrode extending in the substrate between the photosensitive area and the storage area and comprising at least one first opening defining an area of charge transfer between the photosensitive area and the storage area; and
    at least one second insulated vertical electrode extending in the substrate between the storage area and the read area and comprising at least one second opening defining an area of charge transfer between the storage area and the read area;
    wherein a width of the at least one first opening is greater than a width of the at least one second opening.

2. The image sensor of claim 1, wherein the photosensitive area is partially delimited by at least one third insulated vertical electrode extending in the substrate.

3. The image sensor of claim 1, further comprising a charge drain-off area juxtaposed to the photosensitive area.

4. The image sensor of claim 3, wherein at least one fourth insulated vertical electrode extends in the substrate between the photosensitive area and the charge drain-off area.

5. The image sensor of claim 4, wherein said at least one fourth insulated vertical electrode comprises at least one opening defining an area of charge transfer between the photosensitive area and the charge drain-off area.

6. The image sensor of claim 3, wherein said charge drain-off area is connected to a high power supply rail of the sensor.

7. The image sensor of claim 1, further comprising a control circuit configured to apply control signals to said insulated vertical electrodes.

8. The image sensor of claim 1, wherein said read area is coupled to a read circuit of the sensor.

9. The image sensor of claim 1, wherein the substrate is doped with a first conductivity type, the photosensitive area and the storage area are doped with a second conductivity type, and a layer of the first conductivity type having a doping level greater than that of the substrate is formed at the surface of both the photosensitive and storage area.

10. An image sensor, arranged inside and on top of a semiconductor substrate, having a plurality of pixels, each comprising:
    a photosensitive area, a read area, and a storage area extending between the photosensitive area and the read area;
    at least one first insulated vertical electrode extending in the substrate between the photosensitive area and the storage area; and
    at least one second insulated vertical electrode extending in the substrate between the storage area and the read area;
    wherein:
        the photosensitive area has a doping level lower than that of the storage area;
        said at least one first electrode comprises at least one first opening defining an area of charge transfer between the photosensitive area and the storage area;
        said at least one second electrode comprises at least one second opening defining an area of charge transfer between the storage area and the read area; and
        the width of said at least one first opening is greater than the width of said at least one second opening.

11. The image sensor of claim 10, wherein the photosensitive area is partially delimited by at least one third insulated vertical electrode extending in the substrate.

12. The image sensor of claim 10, further comprising a charge drain-off area juxtaposed to the photosensitive area.

13. The image sensor of claim 12, wherein at least one fourth insulated vertical electrode extends in the substrate between the photosensitive area and the charge drain-off area.

14. The image sensor of claim 13, wherein said at least one fourth insulated vertical electrode comprises at least one opening defining an area of charge transfer between the photosensitive area and the charge drain-off area.

15. The image sensor of claim 12, wherein said charge drain-off area is connected to a high power supply rail of the sensor.

16. The image sensor of claim 10, further comprising a control circuit capable of applying control signals to said insulated vertical electrodes.

17. The image sensor of claim 10, wherein said read area is coupled to a read circuit of the sensor.

18. The image sensor of claim 10, wherein the substrate is doped with a first conductivity type, the photosensitive area and the storage area are doped with a second conductivity type, and a layer of the first conductivity type having a doping level greater than that of the substrate is formed at the surface of both the photosensitive and storage area.

19. An image sensor arranged inside and on top of a semiconductor substrate, having a plurality of pixels, each comprising:
    a photosensitive area;
    a read area;
    a storage area extending between the photosensitive area and the read area;

wherein the read area has a higher doping level than the storage area and has a smaller surface area than the storage area;

at least one first insulated vertical electrode extending in the substrate between the photosensitive area and the storage area and having at least one first opening; and at least one second insulated vertical electrode extending in the substrate between the storage area and the read area and having at least one second opening;

wherein a width of the at least one first opening is greater than a width of the at least one second opening.

20. The image sensor of claim 19, wherein the photosensitive area is partially delimited by at least one third insulated vertical electrode extending in the substrate.

21. The image sensor of claim 20, further comprising a charge drain-off area juxtaposed to the photosensitive area.

22. The image sensor of claim 21, further comprising at least one fourth insulated vertical electrode extending in the substrate between the photosensitive area and the charge drain-off area.

* * * * *